United States Patent [19]

Wood et al.

[11] Patent Number: 4,527,269

[45] Date of Patent: Jul. 2, 1985

[54] ENCODER VERIFIER

[75] Inventors: Roger W. Wood, San Joaquin, Calif.; Charles L. Matson, Dayton, Ohio

[73] Assignee: Ampex Corporation, Redwood City, Calif.

[21] Appl. No.: 464,845

[22] Filed: Feb. 8, 1983

[51] Int. Cl.³ .............................................. G06F 11/12
[52] U.S. Cl. ......................................... 371/3; 371/37
[58] Field of Search ....................................... 371/3, 37

[56] References Cited

PUBLICATIONS

Boden, "Self-Checked Error-Correction Code Generator, ECC Comparer, Error Syndrome Decoder and Data Bit Corrector", IBM Technical Disclosure Bulletin, vol. 15, No. 5 (Oct. 1972).
Barsuhn et al., "Self-Testing ECC Logic", IBM Technical Disclosure Bulletin, vol. 20, No. 7, (Dec. 1977).

Primary Examiner—Jerry Smith
Assistant Examiner—Michael R. Fleming
Attorney, Agent, or Firm—Robert K. Schumacher; Charles M. Carman, Jr.; Bradley A. Perkins

[57] ABSTRACT

An encoder verifier checks the functioning of a Reed-Solomon encoder in which data and parity bytes are intended to be digitally encoded in data blocks to form for each data block a respective codeword in multi-bit bytes in the form of a Galois field polynomial that is divisible in the Galois field by a generator polynomial, such generator polynomial being the Galois field product of a plurality of factors. A Galois field polynomial divider divides respective codewords by one of the factors to produce a remainder signal systematically related to the remainder from such division. An indicator responsive to the remainder signal produces an indication of encoder malfunction when the remainder signal corresponds to a remainder other than zero.

9 Claims, 7 Drawing Figures

GALOIS FIELD
NULL 00000000
UNITY 00000001
PRIMITIVE $\alpha$

MULTIPLICATION BY $\alpha^{128}$

ENCODER VERIFIER

The present invention relates to the encoding of data streams and particularly to testing the functioning of an encoder for putting an input data stream into an error-correcting code format that permits correction of multiple errors. Still more particularly the present invention relates to the testing of a Reed-Solomon encoder for a wideband digital recorder, as for television.

The present invention finds particular application to the checking of encoders used in the error correcting systems described in Berlekamp U.S. Pat. No. 4,162,480, issued July 24, 1979 for Galois Field Computer. Portions of that reference will be repeated herein at some length and the rest is hereby incorporated herein by reference.

In any data encoding system, decoding is remote from encoding in space and/or time, or the data would be readily available for use without encoding. For this reason, it is important to know at the time and place of encoding whether or not the encoder is functioning properly, for there is no use in continuing the encoding of data if it cannot be decoded. In the system of the Berlekamp patent, errors of transmission, as in recording and reproduction, are corrected by error-correcting circuits. The proper functioning of such circuits is dependent, however, upon proper encoding in accordance with a particular format. Hence, it is important to be able to tell at the time and place of encoding that the message is encoded in such format.

BACKGROUND OF THE INVENTION

Information transmitted over a communication channel, including a recorder tape, is generally received as a combination of the original information and a noise component. Integrity of the information content is substantially entirely preserved when the signal to noise ratio of the system is large. Accordingly, refinements in design and realization of the appropriate hardware can increase the probability of error-free transmission, theoretically up to the limits imposed by the channel itself. In order to minimize the effect of intrinsic channel limitations, various techniques are employed which ultimately require a compromise between bandwidth and information transfer rate. Various limitations imposed on the channel bandwidth, information rate, and the degree of complexity of receiving and transmitting apparatus contribute to a probable error rate.

Although redundancy is a common element among these techniques, mere repetition exacts a heavy penalty in transmission rate. For example, a single repetition reduces the information rate 50 percent and a second repetition (to implement majority logic) reduces the information rate by $66\frac{2}{3}$ percent. Other means for insuring message integrity have employed sophisticated coding techniques which permit the detection, location, and correction of errors. Among the desiderata of these coding techniques are high information rate and a capability of correcting multiple errors within any given codeword of transmitted data.

In this context a codeword results from encoding operations performed upon the elements of the original data comprising k bits to yield an encoded word ("codeword") of information having k information bits and r check bits. The encoded redundancy in the form of r check bits is then available during the decoding operations to detect and correct errors in the codeword (including all k+r bits) up to some limit or merely to detect errors up to some larger limit.

Many such codes, having distinct mathematical properties, have been studied and mathematically efficient decoding procedures have been devised, but reduction to practice with concomitant efficiency requires a special purpose computer. For example, certain classes of codes are founded on association of each information element of a codeword with an element of a Galois field.

Very briefly, the Galois field is a finite field, the elements of which may be represented as polynomials in a particular primitive field element, with coefficients in the prime subfield. The locations of errors and the true value of the erroneous information elements are determined after constructing certain polynomials defined on the Galois field and finding the roots of these polynomials. A decoder is therefore required which has the capability of performing Galois field arithmetic.

Of the error correcting codes, a particular class of such codes, separately described by Bose, Chaudhuri and Hocquenhem (thu "BCH" codes), are capable of multiple error correction. Special cases of such codes are the Reed-Solomon (RS) Codes with respect to which the present invention will be described.

One approach to the problem of sufficiently high speed error correction of BCH encoded data was described in terms of an algorithm published in Berlekamp, Algebraic Coding Theory (McGraw-Hill, 1968). Prior art employment of the aforesaid algorithm has utilized in one instance a general purpose digital computer controlling an essentially peripheral arithmetic unit implementing Galois field manipulation. Certain prior art arithmetic units have used large stored tables to implement inversions appearing in decoding procedures.

The Berlekamp patent discloses a computer for implementing Galois field arithmetic and algebra. The computer has fewer components, fewer data paths, and higher speed than a general purpose digital computer employed for this purpose. It includes three distinct sub-structures such that arithmetic operations upon data are implemented in an arithmetic unit substructure, memory addressing for such arithmetic unit are separately effected in an address generator substructure, and each said substructure is controlled by a control unit substructure, whereby such substructures are capable of synchronous concurrent operation.

The Berlekamp patent includes a review of the salient aspects of coding theory, applicable to nonbinary BCH codes in general and to RS codes in particular. As a general reference, the text cited above, Algebraic Coding Theory, is recommended. In a binary realization, such codes may be regarded as having three principal positive integer parameters, n, m, and t, where n is the total length in m-bit characters of a word of encoded information, and $n=2^m-1$ and t is the error correcting capability of the code. Assuming no fewer than 2t redundant characters or check characters such a codeword is capable of providing sufficient informational redundancy to detect and correct any set of t or fewer independent errors within the codeword of encoded information, or to correct any set of 2t or fewer independent erasures. An erasure may be defined as an error of known location within the received codeword.

The properties of an algebraic finite field may be summarized briefly. For the purposes of the present invention, a field may be informally defined as a set of elements including the null element, 0, and the unit element, 1, upon which are defined operations of addition, multiplication and division. Addition and multiplication are associative and commutative and multiplication is distributive with respect to addition. Every element of the field has a unique negative such that the negative of a given element summed with that given element itself yields the null or 0. Further, every nonzero element has a unique reciprocal such that the product of such an element with its reciprocal yields the unit element, 1. The elements comprising the field may be considered symbolic representations of binary or ternary or q-ary numbers. The description of the invention will be understood best in terms of a field of characteristic two.

The general finite field is called the Galois field and is specified by two parameters, a prime p, and an integer m, whereby $GF(p^m)$ describes a unique finite field (the Galois field of order $p^m$) having $p^m$ elements. In such a field all operations between elements comprising the field yield results which are again elements of the field. For example, the operation of addition carried out on elements of the finite field GF(2) is defined, modulo 2, according to relations which do not admit of a "carry". Thus, the binary addition tables are: $0+1=1+0=1$ and $0+0=1+1=0$. Arithmetically, this is a "carry-less" addition, sometimes referred to as half addition and more commonly denoted as the exclusive-OR (XOR). It is apparent that absence of a carry thereby limits the magnitude of the resulting sum to the finite field.

The mathematical basis of Reed-Solomon codes and decoding thereof, as discussed in greater detail in Chapter 10 of Algebraic Coding Theory is as follows:

Let $\alpha$ be a primitive element in $GF(2^m)$. The code's generator polynomial is defined by $$g(x) = \sum_{i=f}^{f+d-2} (x - \alpha^i)$$

where d is the code's designed distance. The block length of the Reed-Solomon code is $n=2^m-1$. The codewords consist of all polynomials of degrees $<n$ which are multiples of $g(x)$.

Let $C(x)$ be the transmitted codeword, $$C(x) = \sum_{i=0}^{n-1} C_i x^i.$$

If the channel noise adds to this codeword the error pattern $$E(x) = \sum_{i=0}^{n-1} E_i x^i,$$

then the received word is $$R(x) = \sum_{i=0}^{n-1} R_i x^i = C(x) + E(x).$$

The received codeword may be passed through a re-encoder (also known as a syndrome generator) which produces as its output the remainder of the polynomial division $$S(x) = \text{Remainder}[R(x)/g(x)] = \text{Remainder}[E(x)/g(x)]$$

from which may be derived the weighted power-sum symmetric functions defined by $$S_i = S(\alpha^i) = E(\alpha^i)$$

Since $C(x)$ is a multiple of $g(x)$, it follows that for $i=f, f+1, \ldots f+d-2$, $C(\alpha^i)=0$, whence $$S_i = R(\alpha^i) i = f, f+1, \ldots f+d-2$$

The generating function of the S's may be defined by $$\overline{S}(x) = \sum_{j=1}^{\infty} S_{f+j-1} z^j$$

In order to correct the errors, the decoder may find the corresponding error locations and error values. If $$E(x) = \sum_{i=0}^{n-1} E_i x^i,$$

then the jth error location may be defined as $$X_j = \alpha^{e_j}$$

where the $e_j$ are the unique integers such that $$E_{e_j} \neq 0$$

Erasure locations may be similarly associated with field elements and the corresponding values of errata may be defined as $$Y_j = E_{e_j}$$

To determine the unknown X's and Y's, it is useful to define these polynomials:

Error locator polynomial $$\sigma(z) = \pi(1 - X_i z)$$

$X_i =$ error locations.

Erasure locator polynomial $$\lambda(z) = \pi(1 - X_i z)$$

$X_i =$ erasure locations.

Errata locator polynomial $$\rho(z) = \sigma(z) \cdot \lambda(z)$$

Errata evaluator polynomial $$\omega(z) = \sum_{\text{errata}} z X_i Y_i \pi_{j \neq i} (1 - X_j)$$

To find the X's and Y's, the decoder first multiplies $\overline{S}(z)$ by $\lambda(z)$ to obtain the modified syndrome generating function $$T(z) = \overline{S}(z) \cdot \lambda(z)$$

The unknown errata evaluator polynomial and the unknown error locator polynomial are related by the key equation, $$T(z)\sigma(z) = \omega(z) \bmod z^d$$

Given T(z), low-degree solutions of $\sigma(z)$ and $\omega(z)$ may be found by solving this key equation using the iterative algorithm presented in Algebraic Coding Theory, and later described more succinctly by Sugiyama, et al., A Method For Solving Key Equations for Decoding Goppa Codes, Information & Control, Vol. 27, No. 1, January 1975, pp 87-99.

After the coefficients of $\sigma(z)$ are known, the decoder may evaluate the polynomials $\sigma(1)$, $\sigma(\alpha^{-1})$, $\sigma(\alpha^{-2})$, $\sigma(\alpha^{-3})$, ...

$$\sigma(\alpha^{-i}) = \sum_{j=0}^{\deg \sigma} \sigma_j \alpha^{-ij}$$

If $\sigma(\alpha^{-i}) \neq 0$, then the received character at location $\alpha^i$ is presumed correct (unless erased). If $\sigma(\alpha^{-i}) = 0$ or if $\lambda(\alpha^{-i}) = 0$, then $\alpha^i$ is an errata location, and the received character at that position should be corrected by the value given in Eq. (10.32) of Algebraic Coding Theory:

$$Y_i = \frac{X_i^{1-f} \cdot \omega(X_i^{-1})}{\prod_{\substack{j=1 \\ j \neq i}}^{\pi} (1 - X_j X_i^{-1})}$$

SUMMARY OF THE INVENTION

As stated above, it is desirable to verify the proper functioning of an encoder at the time of encoding. While the decoder of the Berlekamp patent can be used for such verification, as by using it to decode and then comparing the decoded signals with the original signals, this amounts to a substantial overkill when it is not necessary, or even desirable, to correct the signals. The information sought by use of the present invention is not the information being recorded but whether or not the encoder is functioning properly so that the received or reproduced signals can be corrected for errors occasioned in transmission, as in recording and reproducing. For example, a preferred use of the invention is in relatively portable television recorders where space and power is limited or weight is an important factor. The error-correcting computer of the Berlekamp patent is heavy, bulky, complicated and power consuming. It is also expensive.

Another possibility for verifying the operation of the encoder is simply to provide a second identical encoder and compare their outputs. Any difference would indicate a malfunction of one of them. A related possibility is to use a re-encoder. Both of these possibilities require a complete second encoder, which is wasteful of materials, money, power and space.

In accordance with the present invention a light, small, simple, power saving and inexpensive verifying circuit is provided. The invention is based upon the properties of the particular code generated by the encoder. A particular circuit will be described for a (255, 243) Reed-Solomon code, that is one in which the data stream consists of codewords 255 bytes long, of which 12 bytes are parity bytes. In the above notation, $n = 2^m - 1 = 255$, $m = 8$. In such a code, the codewords will be in the form of the polynomial of 8-bit bytes of the form:

$$C(x) = C_{254} x^{254} + C_{253} x^{253} \ldots + C_1 x^1 + C_0$$

Every codeword is a multiple of the generator polynomial, i.e., every codeword can be divided exactly by the generator with zero remainder. The generator itself is a 12th order polynomial in the form $$g(x) = g_{12} x^{12} + g_{11} x^{11} \ldots + g_1 x^1 + g_0$$

which in turn is the product of 12 factors $$g(x) = (x + \alpha^f)(x + \alpha^{f+1}) \ldots (x + \alpha^{f+11})$$

In the particular example set forth below, $f = 122$. Every codeword can therefore be divided exactly by any one of these first order factors to give zero remainder.

In accordance with the present invention an encoder verifier circuit includes means for dividing respective codewords by a factor chosen from the set $x - \alpha^f$ to $X - \alpha^{f+11}$, specifically $\alpha^{133}$ in the example below, and means for determining whether or not there is a non-zero remainder from such division. Means responsive to such non-zero remainder then indicates malfunction of the encoder. Polynomial division and Galois field multiplication as described in the Berlekamp patent are used.

The encoder verifier of the present invention examines encoded codewords (data and parity), checking for a fairly simple parity relationship. This parity check holds for all valid codewords but is violated for reasonably conceivable encoder failures, since the verifier is related to the factored form of the generator polynomial, whereas the encoder is based upon the proper form of the generator polynomial.

It is thus an important aspect of the present invention to provide means for verifying the proper functioning of a Reed-Solomon encoder by dividing in the Galois field the encoded codewords by a factor of the generator polynomial. Another aspect is to provide a polynomial divider circuit for such division. Other aspects and advantages of the present invention will become apparent from the following detailed description of preferred embodiments of the present invention, particularly when taken with the accompanying drawings.

DETAILED DESCRIPTION

Figure 1:
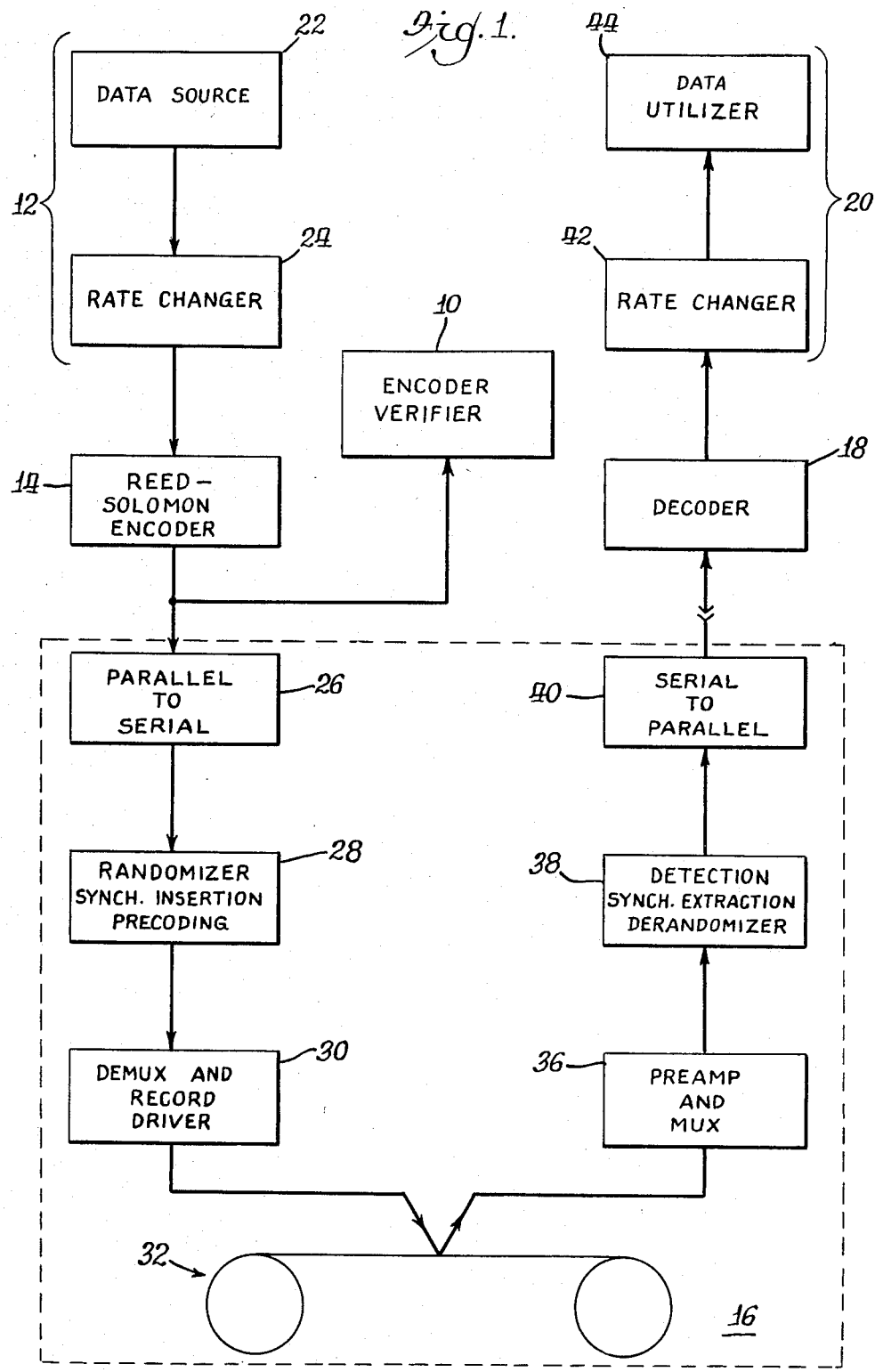
FIG. 1 is a block diagram of a data system, including Reed-Solomon encoder, in which the encoder verifier of the present invention may be used.

In FIG. 1 is illustrated in block form an example of a data system in which an encoder verifier 10 according to the present invention may be used. Such data system includes successively a data input section 12, a Reed-Solomon encoder 14, a data transmission system 16, a decoder 18, and a data output section 20.

In the particular example, the data input section 12 comprises a data source 22 and a rate changer 24. The data source may, for example, include a television camera and means for presenting the resultant data in digital form of parallel 8-bit bytes at a rate of 13.2 megabytes per second. The rate changer 24, by storing the data and reading it out faster than it was put in, reproduces the data at a rate of 14.6 megabytes per second with gaps in the data to accommodate parity bits inserted by the encoder 14 and synchronization words for the purpose of timing recovery.

The encoder 14 of the example is a Reed-Solomon (255, 243) encoder based upon the principles set forth above and as described in greater detail in U.S. Pat. No. 4,162,480. Such encoder forms the data into codewords 255 bytes long each containing 243 data bytes followed by 12 parity bytes in accordance with the Reed-Solomon (255, 243) code. The codewords are interleaved to a depth δ of 16. The codewords are then applied to the data transmission system 16 at the 14.6 megabytes per second rate.

In the transmission system 16, the codewords are converted to serial form by a parallel to serial converter 26, the resulting signal being at the rate of 116.8 megabits per second. The serial bits are applied to a randomizer, synchronization insertion and precoding section 28 which acts in a conventional manner to place the data in better form for recording, as by randomizing and inserting synchronization signals. The randomized signals are applied to a demultiplexing and record driver circuit 30 which demultiplexes the signal among the recording heads of a tape recorder 32, which acts to record the signals for later playback.

Upon playback, the recorded signals are read in analog form by pickup heads from the tape of the recorder 32 and applied to a preamplifier and multiplexing circuit 36 which receives the signals from the several pickup heads, combines them and amplifies them. These signals are applied to a detection, synchronization extraction and derandomizer section 38 which acts to convert the analog signals to digital form, remove the synchronizing signals and derandomize the signals. To the extent all has gone well in the transmission (recording and reproducing), the signals at the output of the detection, synchronization extraction and derandomizer section 38 are in the form at the input to the randomizer, synchronization insertion and precoding section 28. These signals are converted by a serial to parallel circuit 40 into the 8-bit parallel bytes as applied to the data transmission system 16.

The output of the data transmission system is decoded by the decoder 18. The decoder 18 includes a re-encoder and is based upon the principles set forth above and as described in greater detail in the U.S. Pat. No. 4,162,480. Such decoder removes the parity bits and corrects the data for errors (usually caused by the tape recording and reproducing) in the manner described in that patent. The corrected signals are then applied to the data output section 20.

The data output section 20 comprises a rate changer 42 and a data utilization circuit 44. The rate changer 42 acts to return the data to the form and rate of the data at the input to the rate changer 24. The data utilization circuit 44, which may include a monitor, then acts upon the received data in any desired manner.

As noted above, in the usual operation of the data transmission system 16, data are recorded by the recorder 32 without the decoder 18 or data output section on hand. In order to have reasonable certainty that the encoded data are being recorded in a manner admitting of decoding with error correction, the encoder verifier 10 of the present invention is connected to the output of the encoder 14.

Figure 2:
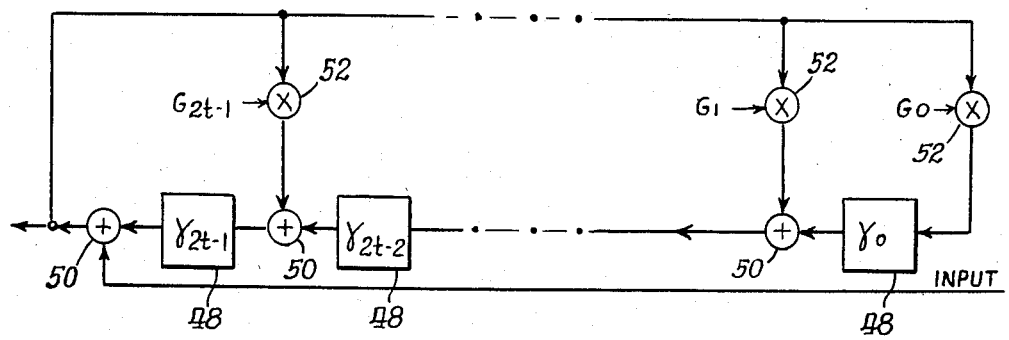
FIG. 2 is a diagrammatic illustration of a circuit implementing polynomial division in a Galois field useful in encoding data in the system illustrated in FIG. 1 or as in a re-encoder.

The operation of the encoder 14 can be more fully understood by reference to FIG. 2.

The general theory of encoders for cyclic codes is described in Algebraic Coding Theory, pages 119 through 125. The parameters of a cyclic code are (a) the arithmetic field containing the codeword symbols
(b) the number, n, of symbols in a codeword
(c) the number, k, of symbols in a message block
(d) a polynomial, g(x), called the generator polynomial.

The degree of $g(x)$ is $n-k$ and $g(x)$ divides $x^n-1$.

A sequence of length n is tested for being a codeword by constructing a polynomial whose coefficients are the terms of the sequence. The first term is the coefficient of $x^{n-1}$:

$$(c_{n-1}, \ldots c_0) \to C(x) = \sum_{i=0}^{n-1} c_i x^i$$

For $(c_{n-1}, \ldots, C_o)$ to be a codeword $C(x)$ must be divisible by $g(x)$.

There are several ways to produce codewords from messages. The preferred encoder 14 uses the following method. Let the message to be encoded $$(m_1, m_2, \ldots, m_k),$$

form $$M(x) = \sum_{i=1}^{k} m_i x^{n-i}$$

and use Euclid's division algorithm to find the quotient and remainder when M(x) is divided by g(x).

$$M(x) = Q(x) \cdot g(x) + P(x)$$

where $$P(x) = P_0 + P_1 x \ldots + P_{n-k-1} x^{n-k-1}$$

Then $$M(x) - P(x) \text{ is divisible by } g(x)$$

and $$(m_1, \ldots m_k, -P_{n-k-1}, \ldots -P_0)$$

is a codeword. The encoder 14 carries out this division process.

At the decoder 18, the first step is to pass the data through a re-encoder which similarly divides the received word by the generator polynomial. The remainder polynomial is called a syndrome and is a function of the errors only, and in the Reed-Solomon case contains all extractable information about the error pattern.

The encoder 14 provides the construction of certain generator polynomials and includes a hardware design technique which reduces the amount of arithmetic circuitry by a factor of two relative to designs based on straight forward mechanization of polynomial division.

In the design of Reed-Solomon encoders, once the field is chosen, the primitive element $\alpha$ must be chosen.

The choice of $\alpha$ and the construction of the generator polynomial is as follows:

If n is the cyclic length and t is the number of errors to be corrected, then the degree of g(x) is 2t and is formed as $$g(x) = \prod_{j=jmin}^{jmax} (x - \alpha^j)$$

$$= \sum_{i=0}^{2t} g_i x^i$$

where $jmin = n+1/2-t$ and $jmax = n-1/2+t$. The unique choice of jmin and jmax results in $g_0 = g_{2t} = 1$ and $g_{2t-i} = g_i$.

The main operation of a Reed-Solomon encoder is to simultaneously multiply the output of the top stage of a register by $g_0, g_1, \ldots, g_{2t-1}$ and add the resulting products into a shifted version of the register (see FIG. 2). The element $\alpha$ is chosen to be that $n^{th}$ root of unity, which minimizes this circuitry when the elements are represented in the hardware basis.

A detailed description of the mechanization of the division process when the arithmetic field is [0,1] (binary arithmetic) and how it is used in an encoder is given in Algebraic Coding Theory. In particular, see FIG. 5.01 in that reference. This description is easily generalized by viewing each stage of a register as containing a symbol from the field instead of a single bit. Certain lines must include a multiplier as part of the circuit. The general circuit is shown in FIG. 2.

The choice of g(x) for the encoder 14 leads to considerable simplification. First, since $g_{2t}=1$, no division circuit is necessary. The circuit of FIG. 2 corresponds to that shown in FIG. 1 of Elwyn R. Berlekamp, "Bit-Serial Reed-Solomon Encoder," IEEE Transactions on Information Theory, Vol. IT-28, No. 6, pp. 869-874, November 1982. Since $g_0=1$, no multiplication circuit is required for the rightmost stage. Furthermore, since $g_i=g_{2t-i}$, only half of the multipliers need to be constructed and the outputs shared. Also, at operating speeds of the encoder 14, it is possible to timeshare the addition circuits, thus reducing the addition circuits by a factor of two.

Finally, for interleaved codes, each stage of the shift register is replaced with a RAM whose address space equals or exceeds the depth of interleaving. When a given address is selected, then the terms of a given parent code are available for reading and writing.

Further explanation of such encoders is contained in the reference Bit-Serial Reed-Solomon Encoders, which is hereby incorporated herein by reference. FIG. 2 shows shift registers 48 wired according to g(x). Also lines shown represent 8-bit characters. Each symbol 50 represents an exclusive OR of two 8-bit words, and each symbol 52 represents a multiplication in the appropriate Galois field.

The encoder operation is based on polynomial division. In regular polynomial division, if the divisor does not divide evenly into the dividend, the remainder is non-zero. However, if the remainder is subtracted from the dividend, and the resulting dividend divided by the divisor, the remainder then is zero. The encode 14 operates in this way. The dividend is a 254th order polynomial, and the divisor is a 12th order polynomial.

The encoder operation is as follows: 243 data bytes are entered into the top 243 positions of the dividend. The remaining 12 low order bytes are filled with zeros. The dividend is divided by the divisor polynomial. The remainder is then subtracted from the dividend. The resulting polynomial is a codeword which is evenly divisible by the divisor polynomial. This is the word that is stored in the magnetic tape of the recorder 32.

One important difference in the encoder arithmetic from regular polynomial arithmetic needs to be pointed out. Since the encoder operates in a Galois field, GF (256), instead of the all real numbers field, the arithmetic operations need to be redefined. Addition and subtraction correspond to the same operation, the bitwise exclusive-OR. Multiplication and division are calculated on tables, and implemented in circuitry by exclusive-OR combinations or through memories, all as described in Algebraic Coding Theory and U.S. Pat. No. 4,162,480.

The encoder verifier 10 takes the encoder output and does a division of its own. It takes advantage of a property of the encoder divisor polynomial; the divisor can be factored into 12 first order polynomials. The verifier 10 divides its input by one of these first order polynomials. If the input is a proper codeword, the remainder from this division should be zero. The verifier 10 outputs the remainder regardless of its value.

Figure 3:
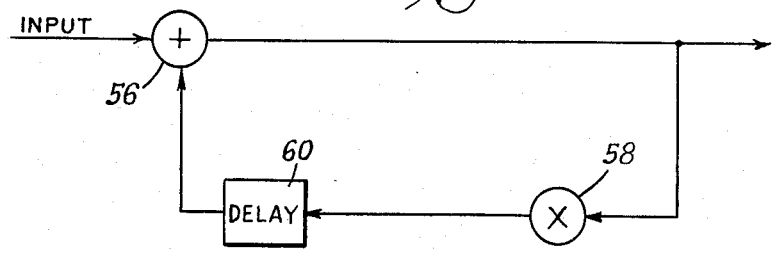
FIG. 3 is a simplified diagrammatic illustration of a circuit implementing polynomial division in a Galois field useful in the encoder verifier of the present invention.

In FIG. 3 is illustrated a simplified polynomial division circuit for the encoder verifier 10. In this case, a serial bit input is applied to one input of an exclusive-OR 56, the output of which is applied to the input of a Galois field multiplier 58. The Galois field multiplier 58 multiplies its input by a constant factor $\alpha$ in the Galois field. The output is applied to a delay register 60, which applies its delayed output to the other input of the exclusive-OR 56.

An explanation of the operation of the polynomial division circuit can be made using a simple example where the encoded codeword can be represented by a 3rd order polynomial:

$$Ax^3 + Bx^2 + Cx + D.$$

If such polynomial is divided by a single factor $x + \beta$, the remainder is:

$$D - C\beta + B\beta^2 - A\beta^3.$$

As stated above, in the Galois field, addition and subtraction are the same and both may be achieved by an exclusive-OR, such as the exclusive-OR 56. One input is the code word in the form A, B, C, D, entered a bit at a time. Thus, bit A is input and added to 0 at its other input by the exclusive-OR 56, the output of the multiplier being set to zero initially. The sum is multiplied by the constant $\alpha$ by the multiplier 58 to form $A\beta$. This is delayed in the delay circuit 60, and added to the next bit B by the exclusive-OR 56 to form $A\beta + B$. This sum is multiplied by $\alpha$ in the multiplier 50 to form $A\beta^2 + B\beta$. This is delayed and added to bit C to form $A\beta^2+B\beta+C$, which is multiplied by $\alpha$ to form $A\beta^3+B\beta^2+C\beta$. This is delayed and added to the next bit D to form $A\beta^3+B\beta^2+C\beta+D$, which is equivalent to the remainder from the above polynomial division. If this remainder is other than zero, the divisor is not a factor of the dividend. As the dividend is a codeword if properly encoded to make the divisor a factor thereof, any remainder indicates an encoding failure. Hence, the added signal after three multiplications indicates the remainder and, if non-zero, an encoding failure.

In the example considered above for a preferred Reed-Solomon encoder 14, the dividend is a 254th order polynomial, but the principle is the same as for a 3rd order polynomial, except that the multiplication and addition must be performed 254 times. Further, in this example the data are encoded in bytes 8 bits wide. The encoder output is interleaved to a depth of 16. This means that the encoder puts out a byte of one codeword, then a byte of another codeword, etc., for 16 codewords before it puts out the next byte of the original codeword being observed. There are also clock signals each byte and an end of block signal at the end of each codeword for synchronization and timing purposes. These are the given products of the encoder 14 from which the encoder verifier 10 determines the functioning of the encoder.

The Galois multiplier may be comprised of a 256×8 PROM (or two 256×4 PROMs) programmed in a conventional manner according to known principles of Galois multiplication. Such multiplication of a register by a wired constant is explained in some detail in Algebraic Coding Theory, particularly at pages 44–47, which pages are hereby incorporated herein by reference. See, also, U.S. Pat. No. 4,162,480. Such explanations will enable those skilled in the art to program the PROM to multiply the respective sums by the particular constant $\alpha$ corresponding to a factor of the generator polynomial. The particular factor chosen is $x+\alpha^{133}$, although any of the factors forming the generator polynomial would be equally valid.

Figure 4:
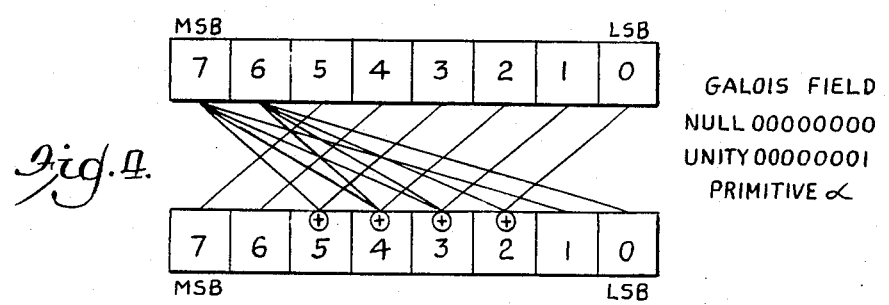
FIG. 4 is a diagrammatic illustration of multiplication of an 8-bit byte by a primitive element $\alpha$.
Figure 5:
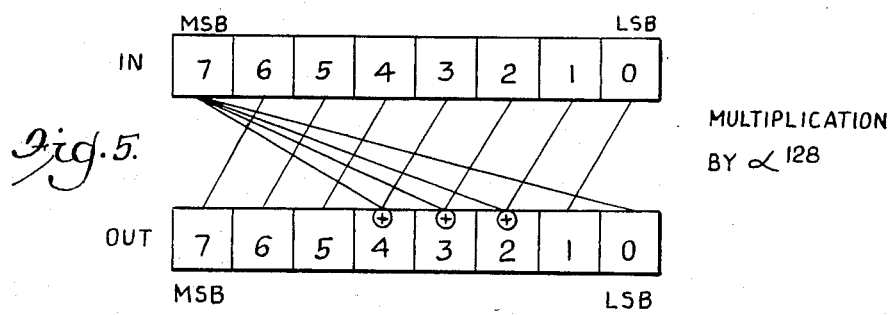
FIG. 5 is a diagrammatic illustration of multiplication by $\alpha^{128}$ in the Galois field of FIG. 5.

Further understanding of Galois field multiplication may be garnered from consideration of FIGS. 4 and 5. FIG. 4 represents an example of an implementation of a multiplication of an 8-bit byte by a primitive element $\alpha$. This operation defines a Galois field GF(256) where the null element is 00000000, and the unity element is 00000001. In this implementation an 8-bit byte applied to the upper register produces an output at the lower register that is the product of the applied byte by the primitive $\alpha$. FIG. 5 represents an implementation of the multiplication of an 8-bit byte by $\alpha^{128}$ in the Galois field defined in FIG. 4. The primitive $\alpha$ is a number chosen so that there is no duplication of outputs for any two different input bytes, of which there are 255 possible combinations when m=1; that is, $2^8-1$. While the multiplication by $\alpha^{128}$ may be implemented by appropriate exclusive-OR gates for summing, in the embodiments discussed below, the implementation is by a PROM. As there are but 255 possible input bytes (not counting null), there are but 255 possible products of any input by $\alpha^{128}$ or any other number for which the PROM is programmed. By using a 255×8 PROM, the 8-bit inputs can address any of the 255 products. The PROM can therefore be programmed by entering the known products as a look-up table addressed by the 8-bit byte inputs.

Figure 6:
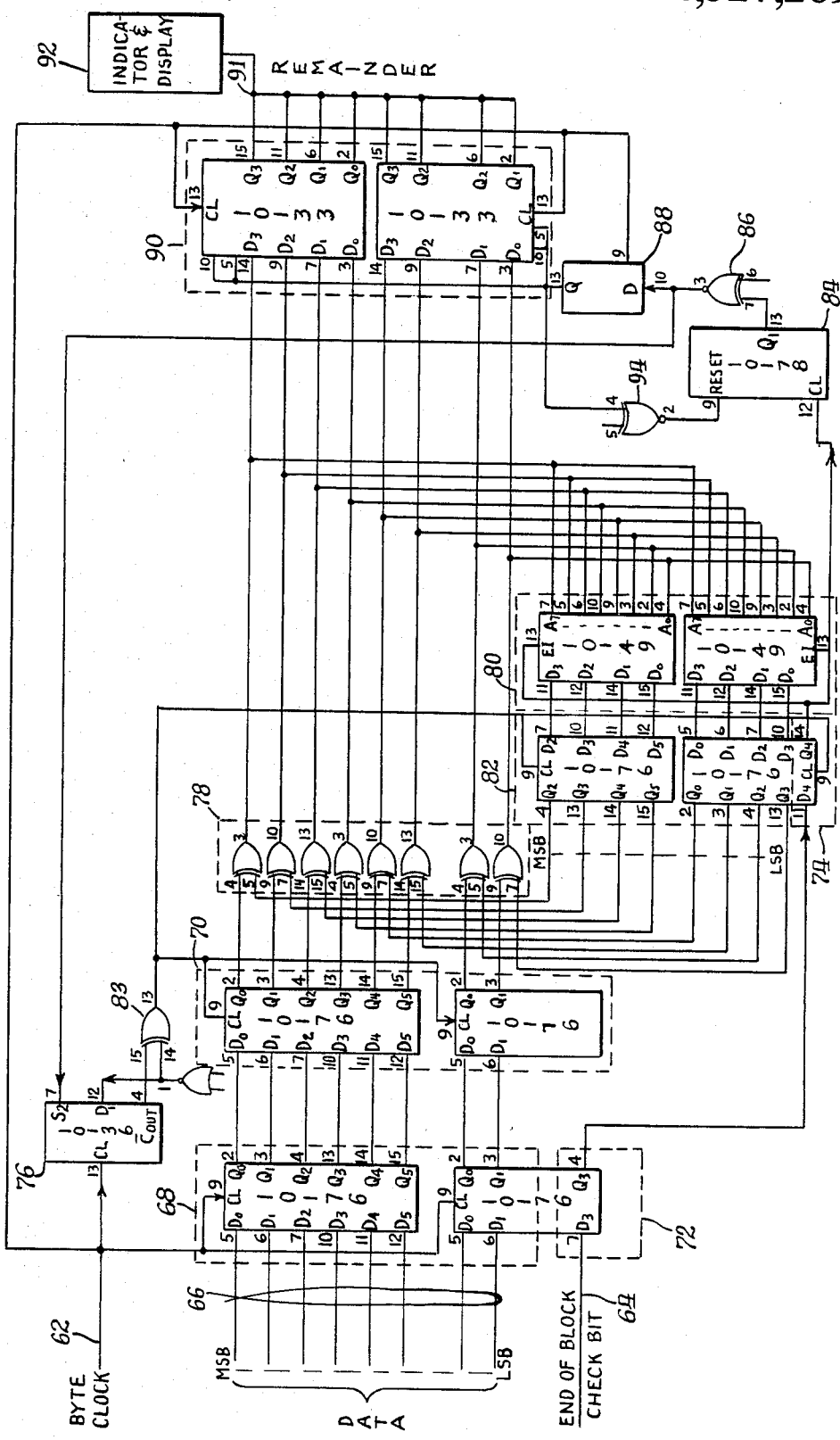
FIG. 6 is a diagrammatic illustration of a preferred form of an encoder verifier according to the present invention for testing the functioning of the Reed-Solomon encoder of the system illustrated in FIG. 1.
Figure 7:
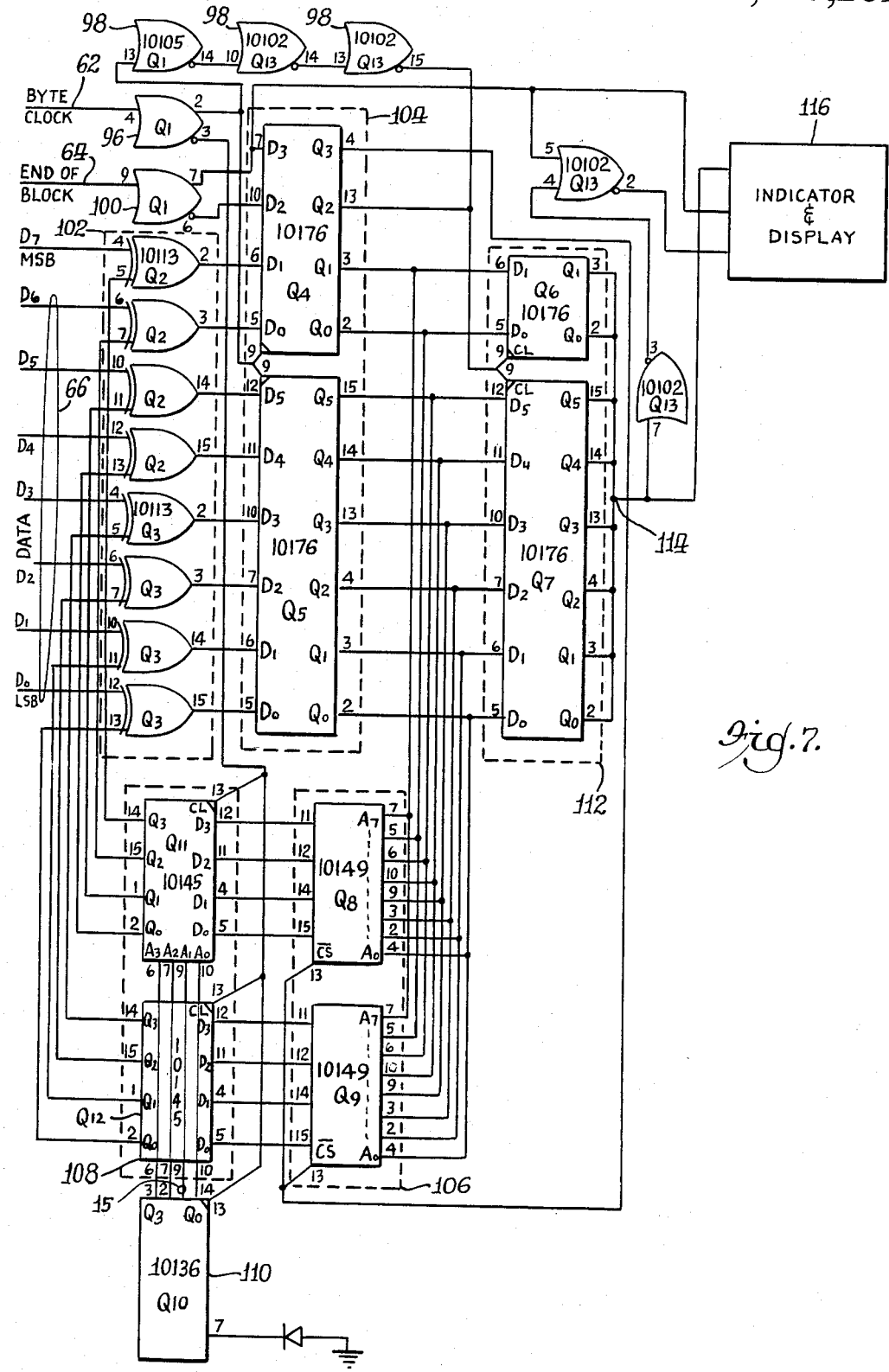
FIG. 7 is a diagrammatic illustration of an alternative embodiment of the encoder verifier according to the present invention for testing the functioning of the Reed-Solomon encoder of the system illustrated in FIG. 1, in which encoder verifier all codewords are checked for proper encoding.

In FIGS. 6 and 7 are illustrated forms of encoder verifier 10 according to two preferred embodiments of the invention. In the form of the encoder verifier 10 shown in FIG. 6 the test circuit divides the encoder clock by 16, so only every 16th byte is admitted in to be divided. In the circuit of FIG. 7 all codewords are divided.

The circuits of FIGS. 6 and 7 expect a positive end of block check bit pulse on a separate line corresponding to the last byte of every codeword in the interleaved output. Such signals are conventionally and necessarily available for reasons of rate changing and insertion of synchronization. In the circuit of FIG. 6, this check bit is used not only to inform the circuit when a word has ended, but also to change phases in the interleaved output. This allows the circuit to test all 16 phases of the output. This circuit ensures a proper division by accepting one of these pulses after a phase change and using that pulse to reset everything in the circuit to be ready for a new division, including resetting the multiplier output to zero. It then divides a complete codeword to the end of the word. When it receives the pulse corresponding to the end of that word, it outputs the remainder and switches to the phase immediately preceding the previous phase. This is accomplished by dividing the encoder clock once by 15 to get to the new phase, and subsequently resuming the division of the encoder clock by 16.

In the encoder verifier 10 shown in FIG. 6, clock pulses from the encoder 14 are applied on a line 62, end of block check bits on a line 64 and codewords in bytes 8-bits wide on lines 66. The codewords are applied to latches 68 and thence to latches 70. As shown in FIG. 6, these latches 68 and 70 may be comprised of D flip flops in 10176 D master-slave flip flops. The end of block check bits are similarly applied through latch circuits 72 and 74, which may also be comprised of 10176 D flip flops. The clock pulses are used to clock various flip flops (latches) and are applied to a divide by 16 circuit 76, which may be comprised of a 10136 4 bit universal binary counter. The output pulses from the divide by 16 circuit 76 are used as clock pulses to certain flip flops or latches to separate a single codeword from the interleaved codewords. The codewords are clocked into respective input terminals of exclusive-ORs 78, the outputs of which are applied to respective input terminals of a Galois field multiplier 80 which may be comprised of two 10149 PROMs (256×4) programmed in accordance with conventional Galois protocols to multiply the input by the appropriate factor $\alpha$. The outputs are applied to latch circuits 82, which may be 10176 D flip flops. The latch circuits 82 are clocked by the output of the divide by 16 circuit 76 through an exclusive-OR 83 to select only every 16th product, which is applied to the exclusive-OR 78 and is thereby added to the 16th following byte, the next byte in the same codeword, thus selecting one of sixteen codewords from the interleaving.

The encoder verifier 10 thus performs polynomial division, dividing one factor of the generator polynomial into a codeword in the manner described above in respect to FIG. 3 until the last byte in the codeword is received. At that time the end of block check bit pulse is applied to a divide by two circuit 84, which may be in the form of a 10178 4-bit binary counter. The output of the divide by two circuit 84 is applied through a NOR 86 to a D flip flop 88. Upon the next clock pulse, the output of the D flip flop 88 enables a latch circuit 90 to latch the remainder from the completed polynomial division into the latch circuit output. The latch circuit 90 may comprise 10133 Quad D latches, gated output, active high enable. The latch circuit 90 outputs are combined by a wired-OR 91 and applied to an indicator and display 92, which provides an indication of encoder malfunction whenever its input indicates a non-zero remainder. The indicator and display 92 may comprise a latch with a lamp and reset. The end of block check bit resets the output of the multiplier 80 to zero for beginning the checking of the next codeword.

In order to test the encoder 14 for all positions of interleaved codewords, the output of the NOR 86 is used to modify the count in the divide by 16 circuit 76 to synchronize with another interleaf position so that after completion of testing of a codeword at one interleaved position, the encoder verifier checks a later codeword at another interleaved position. The output of the D flip flop 88 also operates through a NOR 94 to reset the divide by 2 circuit 84. The Galois field multiplier 80 is disabled by the end of block check bit during the latching of the remainder into the latches 90.

A preferred form of encoder verifier 10 that checks the encoding of all 16 interleaved codewords at once is illustrated in FIG. 7. In this embodiment the byte clock bits are applied on the line 62 to an OR/NOR 96 and inverted through successive OR/NORs 98. The end of block check bits are applied on the line 64 to an OR/NOR 100. The checkword bytes are applied 8 bits wide on lines 66 to exclusive-ORs 102, the outputs of which are applied to latches 104 which may be comprised of 10176 hex D master-slave flip flops, where the signals are latched upon the next clock pulse. Both outputs of the OR/NOR 100 are similarly latched in the latches 104.

The codeword related outputs of the latches 104 are applied to a Galois field multiplier 106 which may be comprised of a pair of 10149 256×4 PROMs, programmed to multiply by a particular number $\alpha$ in the Galois field. The product of such multiplication is in the form of an 8-bit byte and is applied to a shift register 108 which may be comprised of a pair of 10145 16×4 RAMs addressed by a counter 110 which may be comprised of a 10136 4-bit universal binary counter. The counter 110 successively addresses 16 goups of 8 bits. The information previously entered at each of the 8 bit positions is read out on the 8 output lines, and then the information from the Galois field multiplier 106 is written in at the respective addresses. In this way, the addresses are incremented in a 16 address cycle upon each clock bit. This sorts out the products for respective interleaved codewords and outputs the product needed for the current addition by the exclusive-ORs 102, to which that product is applied. The division thus proceeds as in the circuit of FIG. 3 until an end of block bit occurs for a particular codeword.

The sums are latched into latches 112 with the clock pulses following an end of block bit. The outputs of the latches 112 are combined by a wired-OR 114 and applied to an indicator and display 116, which may be like the indicator and display 92. As before, any non-zero remainder at the wired-OR 114 at the end of a block indicates encoder failure. The indicator and display 116 receives the remainder signal upon such completion of the division of an entire codeword and acts to indicate to the operator that the encoder is malfunctioning, so that recording is not uselessly continued. Similarly the end of block bit is applied to the Galois field multiplier to set its output to zero to clear the polynomial division process for the division of the next codeword at the respective interleaved position.

Although two specific preferred embodiments of the present invention have been disclosed in detail, various modifications may be made within the scope of the invention. For example, the encoder verifier 10 may be connected to the output of the data transmission system 16 rather than to its input. In this position, the tape recorder 32 must be bypassed or the recorder will introduce recording errors, such as dropout errors and other noise. The encoder verifier 10 could not then tell whether it was the encoder 14 or the tape recorder 32 at fault. On the other hand, by connecting the encoder verifier 10 at the output of the data transmission system 16 with the tape recorder connected in the system, it would be possible to assess the error performance of the tape recording and hence derive an approximation of how error-free the recording was. That is, once the encoder 14 was found operating properly by testing with the recorder 32 bypassed, testing with the recorder 32 in the circuit would provide an indication of the quality of the recording itself. In such testing of the recorder, the non-zero remainder at the wired-OR 114 can be counted in a rate meter to determine error rate and, hence, recording quality.

It may be noted that the delay in applying the product of multiplying a sum by the constant in the Galois field multiplier is to cause the product to be applied to the respective exclusive-ORs in coincidence with the next byte of the codeword. Such delay of the product may be introduced before or after the actual multiplying or partly before and partly after.

The encoder verifier may be used with other codes. The number m of bits in a byte may be any convenient number greater than 1. There can be any number for the order of the generator polynomial, so long as it can divide the codeword. The codeword can be made shorter by failing to transmit bytes, at some loss in the power of the code.

What is claimed is:

1. An encoder verifier for checking the functioning of an encoder in which data and parity bytes are intended to be digitally encoded in data blocks to form for each data block a respective codeword in multi-bit bytes in the form of a Galois field polynomial that is divisible in the Galois field by a generator polynomial, such generator polynomial being the Galois field product of a plurality of factors, said encoder verifier comprising: polynomial dividing means responsive to codewords for polynomial division in a Galois field of respective codewords by only one of said factors to produce a remainder signal systematically related to the remainder from such division, and indicator means responsive to a said remainder signal corresponding to a remainder signal other than zero for producing an indication of encoder malfunction.

2. A digital encoder verifier for checking the functioning of a Reed-Solomon encoder in which data and parity bytes are intended to be digitally encoded in data blocks to form for each data block a respective codeword in successive m-bit bytes in the form of a Galois field polynomial that is divisible in the Galois field by a generator polynomial, such generator polynomial being the Galois field product of a plurality of factors and m being an integer greater than 1, said encoder verifier comprising Galois field addition means for Galois field adding a received m-bit byte to a delayed m-bit addend to produce an m-bit sum, means for sucessively applying m-bit bytes of a respective codeword to said addition means, Galois field multiplying means for Galois field multiplying said m-bit sum by a predetermined constant corresponding to one of said factors to produce an m-bit product, means for delaying said m-bit product to produce a delayed product and applying the delayed product to said addition means as a delayed m-bit addend at a time when the next successive byte of the respective codeword is applied to said addition means, and indicator means responsive to completion of receipt and addition of the last m-bit byte of a respective codeword and to a said m-bit sum other than zero at that time for producing an indication of malfunction.

3. A digital encoder verifier in accordance with claim 2 wherein said encoder is intended to produce codewords interleaved to a depth $\delta$, where $\delta$ is greater than 1, and clock pulses corresponding to each byte of said codewords, and wherein said means for delaying includes memory means responsive to said clock pulses for receiving m-bit bytes, storing them for $\delta$ clock pulses, and outputting them.

4. A digital encoder verifier in accordance with claim 3 wherein said memory means comprises a shift register.

5. A digital encoder verifier in accordance with claim 4 wherein said shift register comprises a random access memory for receiving bytes into and outputting bytes from addressed positions, and a $\delta$-bit counter responsive to said clock pulses for successively addressing $\delta$ m-bit positions.

6. A digital encoder verifier in accordance with claim 2 wherein said codeword is formed of no more than $2^m - 1$ bytes.

7. A digital encoder verifier in accordance with claim 6 wherein $m = 8$ and said generator polynomial is a 12th order polynomial.

8. A digital encoder verifier in accordance with claim 2 wherein said means for delaying said m-bit product is disposed at least in part in circuit between said addition means and said multiplier means to delay the application of said sum to said multiplier.

9. A digital encoder verifier in accordance with claim 2 wherein said encoder is intended produce codewords interleaved to a depth $\delta$, where $\delta$ is greater than 1, and clock pulses corresponding to each byte of said codewords, said verifier including means responsive to said clock pulses for producing a selection pulse every $\delta$th clock pulse for selecting bytes of a respective interleaved codeword, and means for applying said selected bytes to said addition means.

* * * * *

UNITED STATES PATENT AND TRADEMARK OFFICE
CERTIFICATE OF CORRECTION

PATENT NO. : 4,527,269
DATED : July 2, 1985
INVENTOR(S) : Roger W. Wood and Charles L. Matson It is certified that error appears in the above-identified patent and that said Letters Patent is hereby corrected as shown below:

Column 4, line 4, "$S_i$" should read --$\overline{Si}$--;

Column 4, line 8, "S" should read --$\overline{S}$--;

Column 4, line 62, "S" should read --$\overline{S}$--;

Signed and Sealed this

Nineteenth Day of November 1985

[SEAL]

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,527,269

DATED : July 2, 1985

INVENTOR(S) : Roger W. Wood et al

It is certified that error appears in the above-identified patent and that said Letters Patent is hereby corrected as shown below:

Column 14, line 54, delete "signal: (second occurrence).

Signed and Sealed this

Twenty-fourth Day of May, 1988

Attest:

DONALD J. QUIGG

Attesting Officer

Commissioner of Patents and Trademarks